United States Patent
Miyauchi et al.

(10) Patent No.: US 9,712,037 B2
(45) Date of Patent: Jul. 18, 2017

(54) INSULATED POWER SUPPLY APPARATUS FOR POWER CONVERSION APPARATUS INCLUDING SERIES OF CONNECTIONS OF UPPER AND LOWER ARMS SWITCHING ELEMENTS CONNECTED TO EACH OTHER

(71) Applicant: DENSO CORPORATION, Kariya, Aichi pref. (JP)

(72) Inventors: Syun Miyauchi, Chiryu (JP); Tsuneo Maebara, Nagoya (JP); Yousuke Asako, Anjo (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/490,258

(22) Filed: Sep. 18, 2014

(65) Prior Publication Data
US 2015/0078039 A1 Mar. 19, 2015

(30) Foreign Application Priority Data
Sep. 18, 2013 (JP) .................. 2013-192795

(51) Int. Cl.
*H02M 1/32* (2007.01)
*H02M 1/08* (2006.01)
(Continued)

(52) U.S. Cl.
CPC ............ *H02M 1/08* (2013.01); *H02M 1/32* (2013.01); *H02M 7/5387* (2013.01);
(Continued)

(58) Field of Classification Search
CPC ............ H04L 25/026; H03K 19/003; H03K 19/00307; H03K 19/00315;
(Continued)

(56) References Cited

U.S. PATENT DOCUMENTS 3,162,830 A * 12/1964 Stanton, Jr. ............. H01F 30/10
336/208
7,561,389 B2 * 7/2009 Ishikawa ............... B60L 3/0069
361/31
(Continued)

FOREIGN PATENT DOCUMENTS

JP 11-178356 7/1999
JP 2001-251856 9/2001
(Continued)

OTHER PUBLICATIONS

J Nilsson, S Riedel; Electronic Circuits; 2005, 2001, 2000, 1996 Pearson Education, Inc.; 7th edition; p. 424.*
(Continued)

*Primary Examiner* — Harry Behm
*Assistant Examiner* — Bryan R Perez
(74) *Attorney, Agent, or Firm* — Nixon & Vanderhye PC

(57) ABSTRACT

An insulated power supply apparatus is for a power conversion circuit including at least one series connection of an upper arm switching element and a lower arm switching element connected in series to each other. The insulated power supply apparatus includes an upper arm and lower arm transformers for supplying a driving voltage to the upper arm and lower arm switching elements, respectively, and performs control such that the output voltage of a specific one of the secondary coils of the upper arm and lower arm transformers is kept at a target voltage.

10 Claims, 9 Drawing Sheets

(51) Int. Cl.
*H02M 7/5387* (2007.01)
*H03K 17/06* (2006.01)
*H03K 17/0812* (2006.01)
*H03K 17/61* (2006.01)
*H03K 17/691* (2006.01)
*H02M 3/335* (2006.01)
*H02M 1/00* (2006.01)

(52) U.S. Cl.
CPC ....... *H03K 17/06* (2013.01); *H03K 17/08128* (2013.01); *H03K 17/61* (2013.01); *H03K 17/691* (2013.01); *H02M 3/33523* (2013.01); *H02M 2001/0009* (2013.01); *H02M 2001/0054* (2013.01); *H03K 2217/0036* (2013.01); *Y02B 70/1491* (2013.01)

(58) Field of Classification Search
CPC ....... H03K 19/00346; H03K 19/00353; H03K 19/00361; H03K 17/10; H03K 17/102; H03K 17/107; H03K 17/12; H03K 17/122; H03K 17/127; H03K 17/161; H03K 17/302; H03K 17/56; H03K 17/601; H03K 17/64; H03K 17/691; H03K 17/731; H03K 17/16; H03K 17/30; H03K 17/567; H03K 17/60; H03K 17/687; H03K 17/6871; H03K 17/61; H03K 17/06

USPC .... 363/40, 41, 65, 71, 72, 97, 98, 131, 132, 363/55–56.11; 327/108–110
See application file for complete search history.

(56) References Cited

U.S. PATENT DOCUMENTS

| | | | | |
|---|---|---|---|---|
| 2007/0201172 | A1* | 8/2007 | Hayashi | H02H 7/122 361/52 |
| 2009/0147544 | A1* | 6/2009 | Melanson | H03K 17/691 363/21.01 |
| 2011/0188271 | A1* | 8/2011 | Shinotsuka | H02M 3/335 363/21.15 |
| 2012/0025875 | A1* | 2/2012 | Fukuta | H02M 1/08 327/109 |

FOREIGN PATENT DOCUMENTS

| | | |
|---|---|---|
| JP | 2010-283934 | 12/2010 |
| JP | 2011-045196 | 3/2011 |

OTHER PUBLICATIONS

Office Action (2 pages) dated Aug. 18, 2015 issued in Japanese Application No. 2013-192795 and English translation (2 pages).

* cited by examiner

INSULATED POWER SUPPLY APPARATUS FOR POWER CONVERSION APPARATUS INCLUDING SERIES OF CONNECTIONS OF UPPER AND LOWER ARMS SWITCHING ELEMENTS CONNECTED TO EACH OTHER

This application claims priority to Japanese Patent Application No. 2013-192795 filed on Sep. 18, 2013, the entire contents of which are hereby incorporated by reference.

BACKGROUND OF THE INVENTION

1. Field of the Invention

The present invention relates to an insulated power supply apparatus for a power conversion apparatus including series connections each having an upper arm switching element and a lower arm switching element connected in series to each other.

2. Description of Related Art

Japanese Patent Application Laid-open No. H11-178356 describes an insulated power supply apparatus for supplying a drive voltage to switching elements (IGBTs). This power supply apparatus includes transformers, a transistor for making and breaking electrical connection between the primary coils of the transformers and a DC power source, and a control circuit. The control circuit controls the transistor based on the output voltage of the secondary coil of one of the transformers.

The output voltage of the secondary coil of each of the transformers decreases with the increase of a charging current supplied to the gate of the switching element. This is because the voltage drop within the secondary coil due to a DC resistance and the like increases with the increase of the charging current. In a case where the transistor is controlled such that the output voltage of a specific one of the secondary coils, the charging current outputted therefrom being the smallest of all the secondary coils, is feedback-controlled to a target voltage, there is a concern that the conduction losses of the switching elements may become excessively large for the reasons described below.

In the above case, the output voltage of any secondary coil other than the specific secondary coil is lower than the output voltage of this specific secondary coil. Accordingly, when the switching elements whose gates are connected to the secondary coils other than the specific secondary coil are switched from the off state to the on state, their gate voltages may drop beyond the scope of the design assumption. Therefore, since the collector-emitter saturation voltages of the switching elements increase, the conduction losses of the switching elements may increase excessively.

SUMMARY

An exemplary embodiment provides an insulated power supply apparatus for at least one power conversion circuit that includes at least one series connection of an upper arm switching element and a lower arm switching element connected in series to each other, including:

an upper arm transformer including an upper arm primary coil to be applied with a DC voltage from a DC power source and an upper arm secondary coil for supplying a first driving voltage to the upper arm switching element;

a lower arm transformer including a lower arm primary coil to be applied with the DC voltage from the DC power source and a lower arm secondary coil for applying a second driving voltage to the lower arm switching element;

a voltage detecting section for detecting an output voltage of an object coil which is one of the upper arm and lower arm secondary coils, an output current of the one of the upper arm and lower arm secondary coils being larger than the other of the upper arm and lower arm secondary coils;

a voltage adjustment switching element that applies the DC voltage of the DC power source to the upper arm and lower arm primary coils while being turned on; and a manipulation section that on/off controls the voltage adjustment switching element in order that the output voltage detected by the voltage detecting section is feedback-controlled to a target voltage.

According to the exemplary embodiment, there is provided an insulated power supply apparatus conduction losses of whose switching elements can be made small.

Other advantages and features of the invention will become apparent from the following description including the drawings and claims.

PREFERRED EMBODIMENTS OF THE INVENTION

Figure 1:
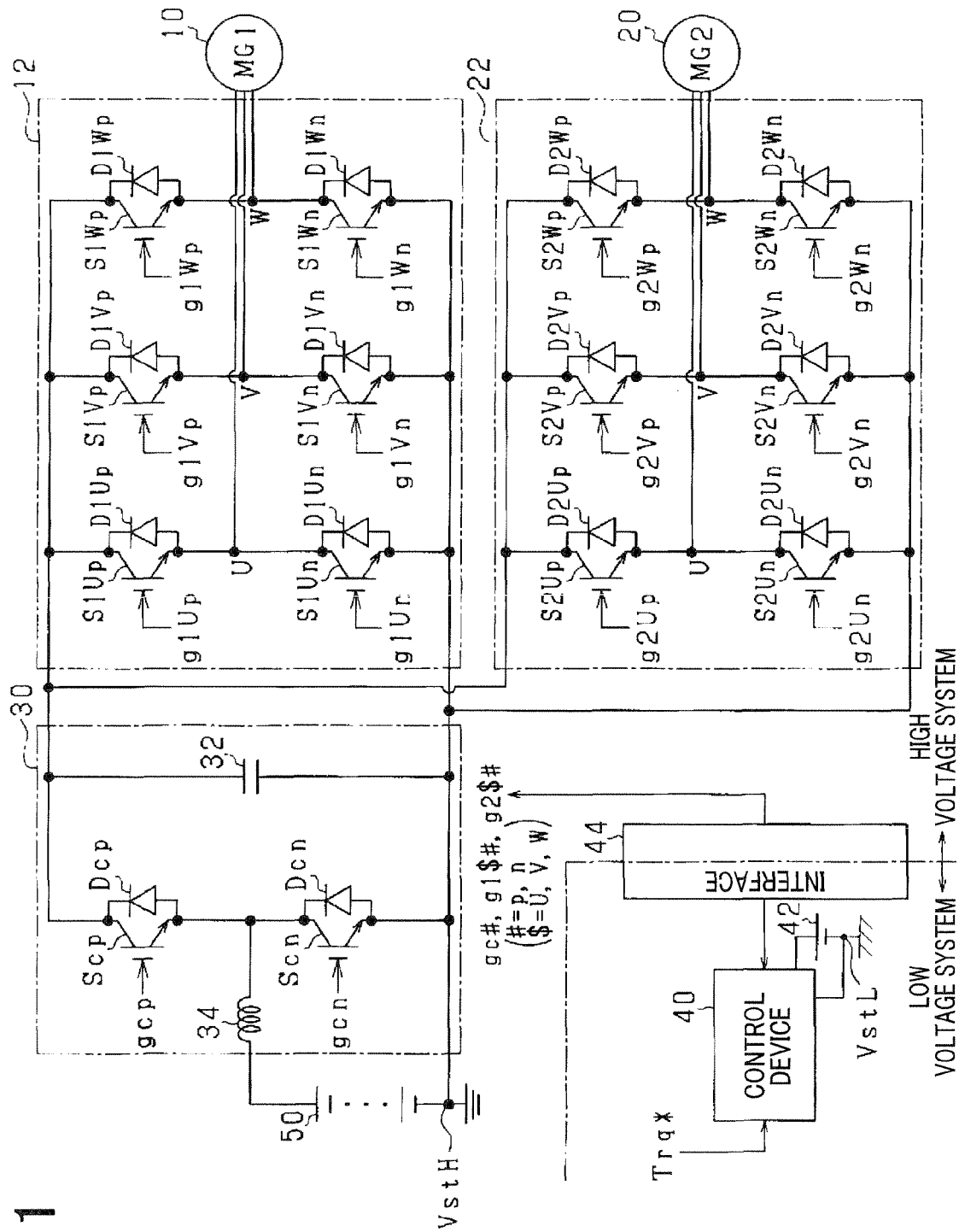
FIG. 1 is a circuit diagram of a motor control system including an insulated power supply apparatus according to a first embodiment of the invention.

In the below described embodiments, the same or equivalent components or parts or portions are indicated by the same reference numerals or characters.

First Embodiment

FIG. 1 is a circuit diagram of a motor control system including an insulated power supply apparatus according to a first embodiment of the invention. The motor control system is for a hybrid vehicle including a combination of an internal combustion engine and an electric rotating machine (motor-generator in this embodiment) as a vehicle driving engine.

As shown in FIG. 1, the motor control system, which is for controlling a first motor-generator 10 and a second motor-generator 20, includes a first inverter 12, a second inverter 22, a stepup converter 30 and a control device 40. The first motor-generator 10 and the second motor-generator 20 are coupled to the driving wheels and the internal combustion engine of the vehicle through a not-shown power split device. The first motor-generator 10 is connected to the first inverter 12, and serves as a generator for applying an initial rotation to the crankshaft of the engine and supplying power to vehicle-mounted electric or electronic units. The second motor-generator 20 is connected to the second inverter 22, and serves as part of the vehicle driving engine. Each of the first and second inverters 12 and 22 is a three-phase inverter, and connected to a high-voltage battery 50 through the stepup converter 30. The high-voltage battery 50 may be a lithium-ion rechargeable battery or a nickel hydrogen rechargeable battery.

Each of the first and second inverters 12 and 22 and the stepup converter 30 serves as a power conversion circuit. The second inverter 22 constitutes a driving power conversion circuit.

The stepup converter 30 includes a capacitor 32, a reactor 34, an upper arm stepup switching element Scp and a lower arm switching element Scn. The stepup switching elements Scp and Scn are connected in series to each other. The series connection of the upper arm stepup switching element Scp and the lower arm stepup switching element Scn is parallel-connected to the capacitor. The connection node of the series connection is connected to the positive electrode terminal of the high-voltage battery 50 through the reactor 34. The stepup converter 30 operates to stepup the output voltage of the high-voltage battery 50 (288 V, for example) to a predetermined voltage (650 V, for example) by turning on and off these stepup switching element Scp and Scn.

The first inverter 12 includes three sets of a combination of a first $-phase upper arm switching element S1$p ($=U, V, W) and a first $-phase lower arm switching element S1$n. The connection node of the first $-phase upper arm and lower arm switching elements S1$p and S1$n is connected to the $-phase of the first motor-generator 10. The second inverter 22 includes three sets of a combination of a second $-phase upper arm switching element S2$p ($=U, V, W) and a second $-phase lower arm switching element S2$n. The connection node of the second $-phase upper arm and lower arm switching elements S2$p and S2$n is connected to the $-phase of the second motor-generator 20.

In this embodiment, as the switching elements Sc#, S1$# and S2$#(#=p,n), voltage-controlled semiconductor switching elements such as an IGBT is used. The switching elements Sc#, S1$# and S2$# are parallel connected with free wheel diodes Dc#, D1$# and D2$#, respectively.

Each of the upper arm stepup switching element Scp, the first $-phase upper arm switching element S1$p and the second $-phase upper arm switching element S2$p serves as an upper arm switching element. Each of the lower arm stepup switching element Scn, the first $-phase lower arm switching element S1$n and the second $-phase lower arm switching element S2$n serves as a lower arm switching element.

The control device 40 is supplied with power from a low-voltage battery 42 as a DC power source, and is constituted mainly of a microcomputer. The control device 40 manipulates the first and second inverters 12 and 22, and the stepup converter 30 to control controlled variables (torques) of the first and second motor-generators 10 and 20 to their command values (command torques). More specifically, the control device 40 generates manipulation signals g1$# and outputs them to drive circuits of the switching elements S1$# of the first inverter 12 to turn on and off the switching element S1$#. The control device 40 generates also manipulation signals g2$# and outputs them to drive circuits of the switching elements S2$# of the second inverter 22 to turn on and off the switching elements S2$#. The control device 40 generates also manipulation signals gc$# and outputs them to drive circuits of the switching elements Sc# of the stepup converter 30 to turn on and off the switching elements Sc#.

In the below descriptions, the drive circuit for driving the upper arm stepup switching element Scp is referred to as the upper arm stepup drive circuit Drcp, the drive circuit for driving the lower arm stepup switching element Scn is referred to as the lower arm stepup drive circuit Drcn, and the drive circuits for driving the first $-phase upper arm and lower arm switching elements S1$# respectively are referred to as the first $-phase upper or lower arm drive circuits Dr1$p and Dr1$n respectively. Likewise, the drive circuits for driving the second $-phase upper arm and lower arm switching elements S2$# respectively are referred to as the second $-phase upper arm and lower arm drive circuit Dr2$p and Dr2$n respectively.

Each of the drive circuits Drcp, Dr1$p and Dr2$p serves as an upper arm drive circuit, and each of the drive circuits Drcn, Dr1$n and Dr2$n serves as a lower arm drive circuit. That is, the upper arm drive circuit is provided for each of the upper arm switching elements, and the lower arm drive circuit is provided for each of the lower arm switching elements.

The upper arm manipulation signals gcp, g1$p and g2$p and the lower arm manipulation signals gcn, g1$n and g2$n are respectively in a complimentary relationship with each other. That is, the upper arm switching elements Scp, S1$p and S2$p and their corresponding lower arm switching elements Scn, S1$n, S2$n are alternately turned on, respectively. The command torque Trq* is received from a control device at a higher level than the control device 40. The control device at the higher level may be a control unit for performing overall control of the vehicle.

The low-voltage battery 42 whose output voltage is lower than that of the high-voltage battery 50 may be a lead-acid storage battery.

The motor control system includes an interface 44 for providing electrical insulation between a high voltage system and a low voltage system and enabling signal transmission between these two systems. The high voltage system includes the high-voltage battery 50, the first and second inverters 12 and 22, the stepup converter 30 and the first and second motor-generators 10 and 20. The low voltage system includes the low-voltage battery 42 and the control device 40. The interface 44 may include photocouplers. In this embodiment, the reference voltage VstL of the low voltage system and the reference voltage VstH of the high voltage system are different from each other. In this embodiment, a reference voltage VstH of the high voltage system is set at the voltage of the negative electrode terminal of the high-voltage battery 50, and the reference voltage VstL of the low voltage system is set at the vehicle body potential equal to the intermediate value between the voltages of the positive and negative electrode terminals of the high-voltage battery 50.

Next, the insulated power supply apparatus that supplies driving voltages to the drive circuits for driving the switching elements Sc#, S1$# and S2$# is explained with reference to FIGS. 2 and 3.

The driving voltage supplied to the upper and lower stepup drive circuits Drcp and Drcn and the first $-phase upper arm and lower arm drive circuits Dr1$p and Dr1$n are controlled by a first power supply circuit including a first power supply IC 52. The driving voltage supplied to the second $-phase upper arm and lower arm drive circuits Dr2$p and Dr2$n are controlled by a second power supply circuit including a second power supply IC 54.

First, the first power supply circuit including the first power supply IC 52 is explained with reference to FIG. 2.

Figure 2:
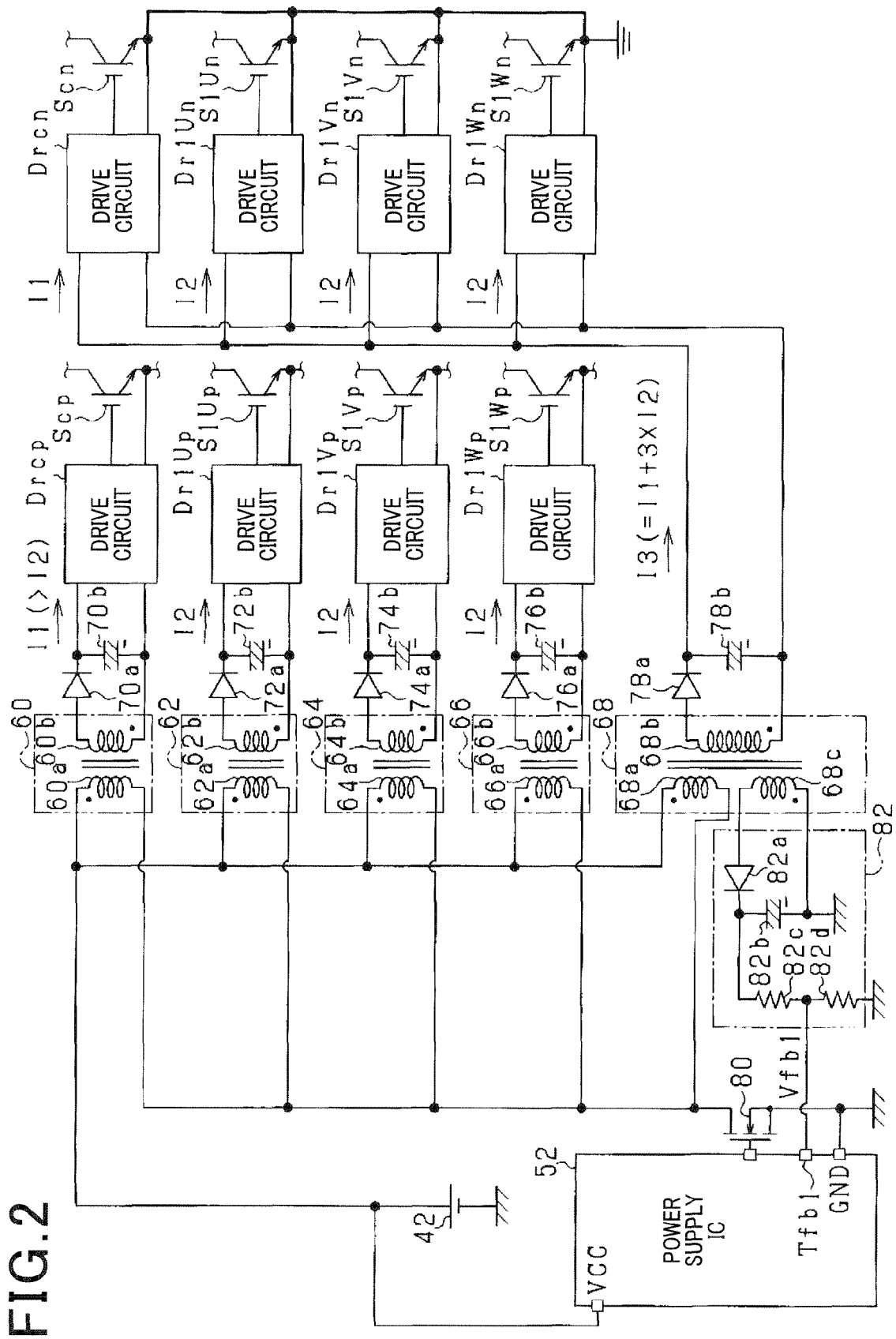
FIG. 2 is a diagram showing a structure of a first power supply circuit of the insulated power supply apparatus according to the first embodiment of the invention.

The first power supply circuit shown in FIG. 2 is a flyback switching power supply including first to fifth transformers 60, 62, 64, 66 and 68, first to fifth diodes 70a, 72a, 74a, 76a and 78a, first to fifth capacitors 70b, 72b, 74b, 76b and 78b, an N-channel MOSFET (the first voltage adjustment switching element 80, hereinafter) and a first feedback circuit 82. In this embodiment, the first to fifth capacitors 70b, 72b, 74b, 76b and 78b are electrolytic capacitors. Each of the first to fourth transformers 60, 62, 64 and 66 operates as an upper arm transformer, and the fifth transformer operates as a lower arm transformer.

The upper arm transformer is provided for each of the upper arm switching elements. More specifically, the first transformer 60 supplies the driving voltage to the upper arm stepup drive circuit Drcp, and the second transformer 62 supplies the driving voltage to the first U-phase upper arm drive circuit Dr1Up. Further, the third transformer 64 supplies the driving voltage to the first V-phase upper arm drive circuit Dr1Vp, and the fourth transformer 66 supplies the driving voltage to the first W-phase upper arm drive circuit Dr1Wp.

The lower arm transformer, which is provided commonly for the lower arm switching elements, includes a common secondary coil capable of supplying the driving voltage to the respective lower arm switching elements. More specifically, the fifth transformer 68 as the common transformer supplies the driving voltage to the lower arm stepup drive circuit Drcn and the first U-, V- and W-phase lower arm drive circuits Dr1Un, Dr1Vn and Dr1Wn.

The positive and negative electrode terminals of the low-voltage battery 42 are connected to each other through a parallel connection of first to fifth primary coils 60a, 62a, 64a, 66a and 68a of the first to fifth transformers 60, 62, 64, 66 and 68, and the first voltage adjustment switching element 80. That is, the first voltage adjustment switching element 80 forms, when being turned on, a closed circuit including the low-voltage battery 42, the first to fifth primary coils 60a, 62a, 64a, 66a and 68a, and the first voltage adjustment switching element 80.

The first secondary coil 60b of the first transformer 60 is connected to the upper arm stepup drive circuit Drcp through the first diode 70a and the first capacitor 70b. The second secondary coil 62b of the second transformer 62 is connected to the first U-phase upper arm drive circuit Dr1Up through the second diode 72a and the second capacitor 72b. The third secondary coil 64b of the third transformer 64 is connected to the first V-phase upper arm drive circuit Dr1Vp through the third diode 74a and the third capacitor 74b. The fourth secondary coil 66b of the fourth transformer 66 is connected to the first W-phase upper arm drive circuit Dr1Wp through the fourth diode 76a and the fourth capacitor 76b.

The fifth secondary coil 68b of the fifth transformer 68 is connected to the lower arm stepup drive circuit Drcn and the first U-, V- and W-phase lower arm drive circuits Dr1Un, Dr1Vn and Dr1Wn through the fifth diode 78a and the fifth capacitor 78b.

The fifth transformer 68 includes a first feedback coil 68c as a voltage detecting coil. The number of turns of the first to fifth secondary coils 60b, 62b, 64b, 66b and 68b is equal to the number of turns of the first feedback coil 68c. This makes it possible that the output voltage of the first feedback coil 68c is equal to the output voltage of each of the first to fifth secondary coils 60b, 62b, 64b, 66b and 68b.

The output voltage of the first feedback coil 68c is supplied to the first power supply IC 52 through the first feedback circuit 82. The first feedback circuit 82 includes a first detection diode 82a, a first detection capacitor 82b, a first resistor 82c and a second resistor 82d. The output voltage of the first feedback coil 68c is divided by the first resistor 82c and the second resistor 82d after passing the first detection diode 82a. The output voltage of the first feedback coil 68c divided by the first resistor 82c and the second resistor 82d is inputted to the first power supply IC 52 as a first feedback voltage Vfb1 through a first detection terminal Tfb1 of the first power supply IC 52. The fifth secondary coil 68b serves as an object coil, and the first feedback coil 68c and the first feedback coil 82 serve as a voltage detecting section.

The first power supply IC 52, which serves as a manipulation section, on/off-controls the first voltage adjustment switching element 80 to feedback-controls the first feedback voltage Vfb1 to a target voltage Vtgt.

Next, a second power supply circuit including the second power supply IC 54 is explained with reference to FIG. 3.

Figure 3:
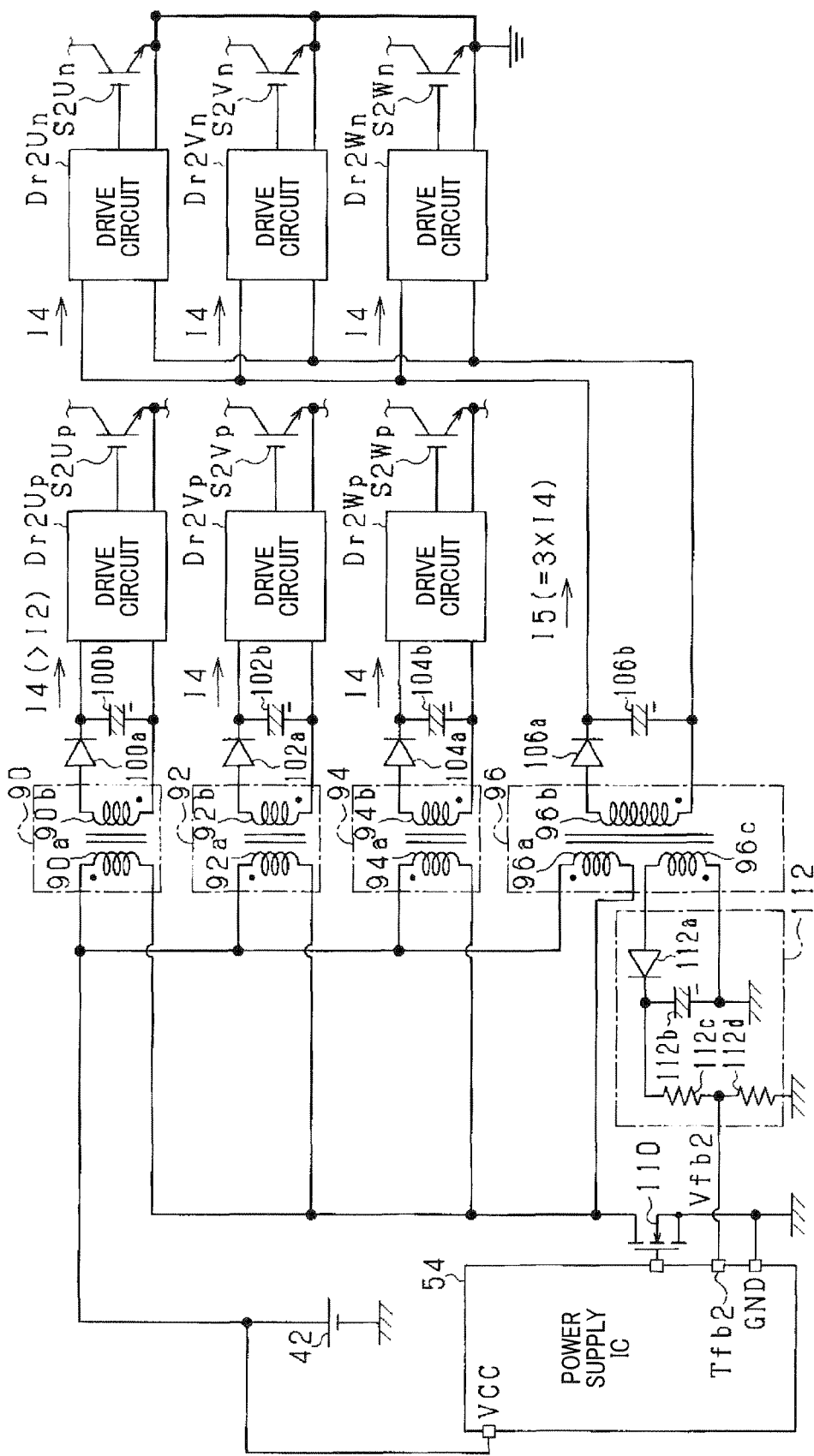
FIG. 3 is a diagram showing a structure a second power supply circuit of the insulated power supply apparatus according to the first embodiment of the invention.

The second power supply circuit shown in FIG. 3 is a flyback switching power supply including sixth to ninth transformers 90, 92, 94 and 96, sixth to ninth diodes 100a, 102a, 104a and 106a, sixth to ninth capacitors 100b, 102b, 104b and 106b, an N-channel MOSFET (the second voltage adjustment switching element 110, hereinafter) and a second feedback circuit 112. In this embodiment, the sixth to ninth capacitors 100b, 102b, 104b and 106b are electrolytic capacitors. Each of the sixth to eighth transformers 90, 92 and 94 serves as an upper arm transformer, and the ninth transformer serves as a lower arm transformer.

The sixth transformer 90 supplies the driving voltage to the second U-phase upper arm drive circuit Dr2Up. The seventh transformer 92 supplies the driving voltage to the second V-phase upper arm drive circuit Dr2Vp. The eighth transformer 94 supplies the driving voltage to the second W-phase upper arm drive circuit Dr2Wp.

The ninth transformer supplies the driving voltage to the second U-, V- and W-phase lower arm drive circuits Dr2Un, Dr2Vn and Dr2Wn.

The positive and negative electrode terminals of the low-voltage battery 42 are connected to each other through a parallel connection of sixth to ninth primary coils 90a, 92a, 94a and 96a of the sixth to ninth transformers 90, 92, 94 and 96, and the second voltage adjustment switching element 110. That is, the second voltage adjustment switching element 110 forms, when being turned on, a closed circuit including the low-voltage battery 42, the sixth to ninth primary coils 90a, 92a, 94a and 96a, and the second voltage adjustment switching element 110.

The sixth secondary coil 90b of the sixth transformer 90 is connected to the second U-phase upper arm drive circuit Dr2Up through the sixth diode 100a and the sixth capacitor 100b. The seventh secondary coil 92b of the seventh transformer 92 is connected to the second V-phase upper arm drive circuit Dr2Vp through the seventh diode 102a and the seventh capacitor 102b. The eighth secondary coil 94b of the eighth transformer 94 is connected to the second W-phase upper arm drive circuit Dr2Wp through the eighth diode 104a and the eighth capacitor 104b.

The ninth secondary coil 96b of the ninth transformer 96 is conneter to the second U-, V- and W-phase lower arm drive circuit Dr2Un, Dr2Vn and Dr2Wn through the ninth diode 106a and the ninth capacitor 106b.

The ninth transformer 96 includes a second feedback coil 96c as a voltage detecting coil. The number of turns of the sixth to ninth secondary coils 90b, 92b, 94b and 96b is equal to the number of turns of the second feedback coil 96c. This makes it possible that the output voltage of the second feedback coil 96c is equal to the output voltage of each of the sixth to ninth secondary coils 90b, 92b, 94b and 96b.

The output voltage of the second feedback coil 96c is supplied to the second power supply IC 54 through the second feedback circuit 112. The second feedback circuit 112 includes a second detection diode 112a, a second detection capacitor 112b, a third resistor 112c and a fourth resistor 112d. The output voltage of the second feedback coil 96c is divided by the third resistor 112c and the fourth resistor 112d after passing the second detection diode 112a. The output voltage of the second feedback coil 96c divided by the third resistor 112c and the fourth resistor 112d is inputted to the second power supply IC 54 as a second feedback voltage Vfb2 through a second detection terminal Tfb2 of the second power supply IC 54. The ninth secondary coil 96b serves as an object coil, and the second feedback coil 96c and the second feedback circuit 112 serve as a voltage detecting section.

The second power supply IC 54, which serves as a manipulation section, on/off-controls the second voltage adjustment switching element 110 to feedback-control the second feedback voltage Vfb2 to the target voltage Vtgt.

Next, the drive circuits Drc#, Dr1$# and Dr2$# are explained in detail. The drive circuits Drc#, Dr1$# and Dr2$# are the same in structure. Accordingly, the structure of the first U-phase Upper arm drive circuit Dr1Up is explained as an representative example.

Figure 4:
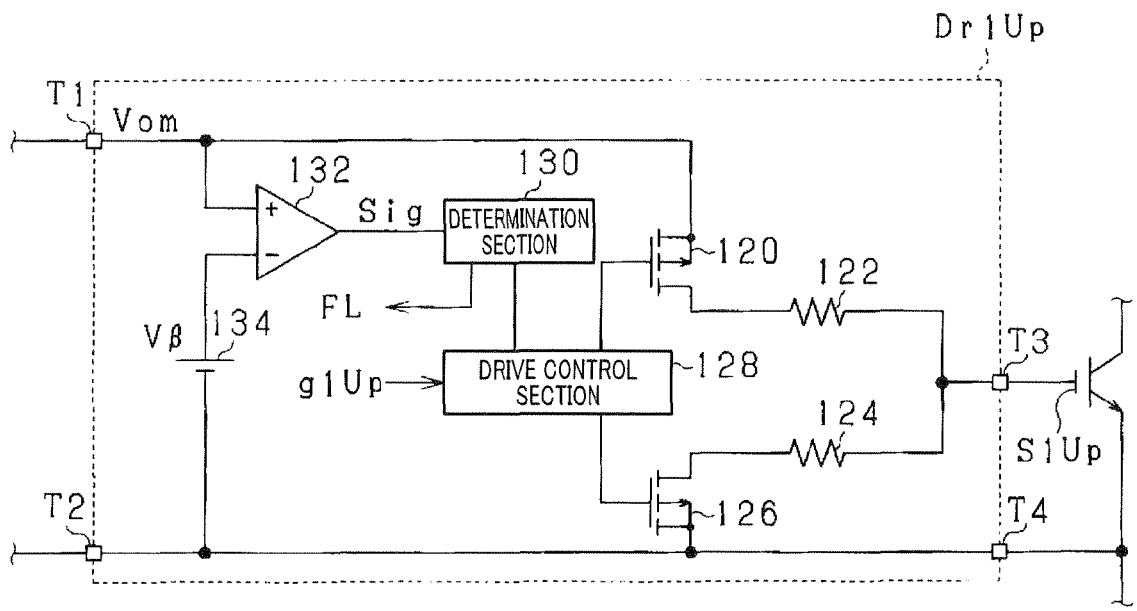
FIG. 4 is a circuit diagram of an IGBT drive circuit included in the insulated power supply apparatus according to the first embodiment of the invention.

The connection node of the second diode 72a and the second capacitor 72b is connected to a first terminal T1 of the first U-phase upper arm drive circuit Dr1Up shown in FIG. 4. The connection node of the second coil 62b and the second capacitor 72b is connected to a second terminal T2 of the first U-phase upper arm drive circuit Dr1Up.

The first terminal T1 is connected to the gate of the first U-phase upper arm switching element S1Up through a P-channel MOSFET (the charging switching element 120 hereinafter), a charging resistor 122 and a third terminal T3 of the first U-phase upper arm drive circuit Dr1Up. The gate of the first U-phase upper arm switching element S1Up is connected to the output terminal (emitter) of the first U-phase upper arm switching element S1Up through the third terminal T3, a discharging resistor 124, an N-channel MOSFET (the discharging switching element 126 hereinafter) and a fourth terminal T4 of the first U-phase upper arm drive circuit Dr1Up. The second terminal T2 is short-circuited to the fourth terminal T4 within the first U-phase upper arm drive circuit Dr1Up.

The first U-phase upper arm drive circuit Dr1Up includes a drive control section 128. The drive control section 128 drives the first U-phase upper arm switching element S1Up by performing a charging process and a discharging process alternately by manipulating the charging switching element 120 and the discharging switching element 126 in accordance with the manipulation signal g1Up received from the control device 40 through the interface 44. The charging process is such that the discharge switching element 126 is turned off and the charging switching element 120 is turned on when the manipulation signal g1Up is detected to represent an on-manipulation command. The discharging process is such that the discharge switching element 126 is turned on and the charging switching element 120 is turned off when the manipulation signal g1Up is detected to represent an off-manipulation command.

As explained in the foregoing, the controlled variable in the feedback control by the first power supply IC 52 is set equal to the output voltage (divided output voltage more correctly) of the fifth secondary coil 68b of the fifth transformer 68. This is for reducing the conduction losses of the upper arm stepup switching element Scp and the first U-, V- and W-phase upper arm switching elements S1Up, S1Vp and S1Wp. The reason why the conduction losses can be reduced by setting the controlled variable equal to the output voltage of the fifth secondary coil 68b is explained in detail below.

In this embodiment, the charging current to be supplied to the gates of the upper arm and lower arm stepup switching elements Scp and Scn to turn on them is set larger than the charging current to be supplied to the gates of the first $-phase upper arm and lower arm switching elements S1$# to turn on them. This is because the gate charge capacitance Qg of the upper arm and lower arm stepup switching elements Scp and Scn is larger than the gate charge capacitance Qg of the first $-phase upper arm and lower arm switching elements S1$#.

Accordingly, the current I1 supplied from the first secondary 60b to the upper arm stepup drive circuit Drcp is larger than the current I2 supplied from the second to fourth secondary coils 62b, 64b and 66b to the first U-, V- and W-phase upper arm drive circuits Dr1Up, Dr1Vp and Dr1Wp, respectively. The fifth secondary coil 68b is required to supply a current to each of the lower arm drive circuits Drcn, Dr1Un, Dr1Vn and Dr1Wn. Accordingly, the current I3 supplied from the fifth secondary coil 68b to the drive circuit Drcn, Dr1Un, Dr1Vn and Dr1Wn is larger than the current I1. That is, in the first power supply circuit mainly constituted of the first power supply IC 52, of all the currents supplied respectively from the first to fifth secondary coils 60b, 62b, 64b, 66b and 68b, the current I3 supplied from the fifth secondary coil 68b is the largest.

Figure 5:
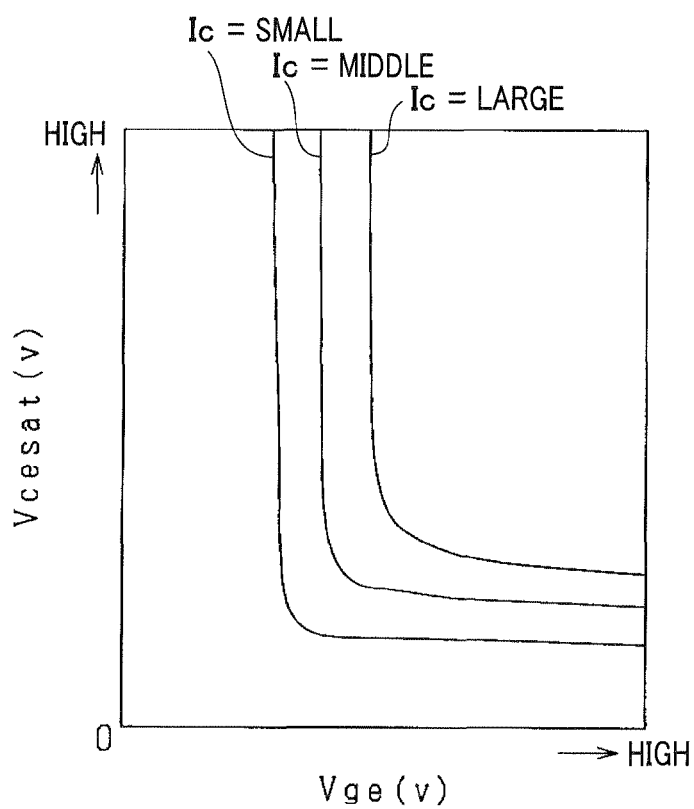
FIG. 5 is a diagram showing the characteristic of the collector-emitter saturation voltage of the IGBT.

The output voltage of the secondary coil decreases with the increase of the charging current to be supplied to the gate. This is because, taking the first U-phase upper arm switching element S1Up for example, the output current of the second secondary coil 62b and the voltage drop due to the DC resistance and the second diode 72a increase with the increase of the charging current. It might occur that the output voltage of the second secondary coil 62b is used as the controlled variable for the feedback control. However, in this case, the output voltages of the first secondary coil 60b and the fifth secondary coil 68b become lower than the output voltage of the second secondary coil 62b. Accordingly, the gate voltage Vge of each of the upper arm and lower arm stepup switching elements Scp and Scn and the first U-, V- and W-phase lower-arm switching elements S1Un, S1Vn and S1Wn drops beyond the scope of the design assumption. As a result, since the collector-emitter saturation voltage Vcesat of each of the upper arm and lower arm stepup switching elements Scp and Scn and the first U-, V- and W-phase lower-arm switching elements S1Un, S1Vn and S1Wn increases, the conduction losses of these switching element Scp, Scn, S1Un, S1Vn, S1Wn increase (see FIG. 5).

Accordingly, in this embodiment, the output voltage of the fifth secondary coil 68b is used as the controlled variable in the feedback control, so that the output voltages of the first to fourth secondary coils 60b, 62b, 64b and 66b are higher than the output voltage of the fifth secondary coil 68b used as the controlled variable. Therefore, it is possible to prevent the gate voltages of the upper arm and lower arm stepup switching elements Scp and Scn and the first U-, V- and W-phase lower-arm switching elements S1Un, S1Vn and S1Wn from dropping beyond the scope of the design assumption, to thereby reduce the conduction losses of these switching element Scp, Scn, S1Un, S1Vn, S1Wn.

In this embodiment, the target voltage Vtgt is set such that the input voltage Vom (the voltage between the first terminal T1 and the second terminal T2) of each of the drive circuits Drc# and Dr1$# is higher than the lower limit of the operation guarantee voltage range of the drive circuits Drc# and Dr1$#. More specifically, the target voltage Vtgt is set higher than the value Vα of the lower limit of the operation guarantee voltage range divided by the first and second resistors 82c and 82d.

On the other hand, the output voltage of the ninth secondary coil 96b is used as the controlled variable in the feedback control by the second power supply IC 54. This is for reducing the conduction losses of the second U-, V- and W-phase upper arm switching element S2Up, S2Vp and S2Wp. The reason why the conduction losses can be reduced by using the output voltage of the ninth secondary coil 96b as the controlled variable is explained below.

The current I5 supplied from the ninth secondary coil 96b to the second U-, V- and W-phase lower arm switching element Dr2Un, Dr2Vn and Dr2Wn is larger than the current I4 respectively supplied from the sixth to the eighth secondary coils 90b, 92b and 94b to the second U-, V- and W-phase upper arm switching element Dr2Up, Dr2Vp and Dr2Wp. That is, in the second power supply circuit mainly constituted of the second power supply IC 54, of all the currents supplied respectively from the sixth to ninth secondary coils 90b, 92b, 94b and 96b, the current I5 supplied from the ninth secondary coil 96b is the largest. Accordingly, the output voltage of the ninth secondary coil 96b becomes the lowest.

Therefore, by using, as the controlled variable in the feedback control, the output voltage of the ninth secondary coil 96b which becomes the lowest, the output voltages of the sixth to eighth secondary coils 90b, 92b and 94b become higher than the output voltage of the ninth secondary coil 96b. Hence, the conduction losses of the second U-, V- and W-phase upper arm switching elements S2$p can be reduced.

In this embodiment, the charging current to be supplied to the gates of the $-phase upper arm and lower arm switching elements S2$# to turn on these switching elements S2$# is set larger than the charging current to be supplied to the first $-phase upper arm and lower arm switching element S1$# to turn on these switching element S1$#. This is because the gate charge capacitance Qg of each of the second $-phase upper arm and lower arm switching elements S2$# is set larger than the gate charge capacitance Qg of each of the first $-phase upper arm and lower arm switching elements S1$#. Accordingly, the current I4 respectively supplied from the sixth to eighth Secondary coils 90b, 92b and 94b to the Drive circuit Dr2Up, Dr2Vp and Dr2Wp is larger than the I2 respectively supplied from the second to fourth Secondary coils 62b, 64b and 66b to the drive circuit Dr1Up, Dr1Vp and Dr1Wp.

According to the configuration described above, the conduction losses can be reduced. However, in the first power supply circuit mainly constituted of the first power supply IC52, the output voltages of the first to fourth secondary coils 60b, 62b, 64b and 66b become higher than the output voltage of the fifth secondary coil 68b used as the controlled variable. Accordingly, there is a concern that the drive circuits Drcp, Dr1Up, Dr1Vp and Dr1Wp may be applied with an overvoltage.

Hence, each of the drive circuits Drc#, Dr1$# and Dr2$# is provided with an overvoltage protection function. This overvoltage protection function is explained with reference to FIG. 4.

As shown in FIG. 4, the first U-phase upper arm drive circuit Dr1Up is provided with a determination section 130. The determination section 130 performs an overvoltage abnormality determination process to determine whether or not the input voltage of the input voltage Vom of the first U-phase upper arm drive circuit Dr1Up is excessively high based on the output signal Sig of a comparator 132. The non-inverting input terminal of the comparator 132 is connected to the first terminal T1. The inverting input terminal of the comparator 132 is connected to the positive terminal of a voltage source 134. The negative terminal of the voltage source 134 is connected to the second terminal T2. The output voltage (the specified voltage Vbeta hereinafter) of the voltage source 134 is set to the upper limit of a voltage range within which the first U-phase upper arm drive circuit Dr1Up can be guaranteed to operate normally.

Incidentally, in the first power supply circuit mainly constituted of the first power supply IC 52, it is not imperative that the drive circuits Drcn and Dr1$n are provided with such a overvoltage protection function. This is because the output voltage of the fifth secondary coil 68b connected to the drive circuits Drcn and Dr1$n is used as the controlled variable for the feedback control. For the same reason, in the second power supply circuit mainly constituted of the second power supply IC 54, it is not imperative that the drive circuit Dr2$n is provided with such a overvoltage protection function.

Figure 6:
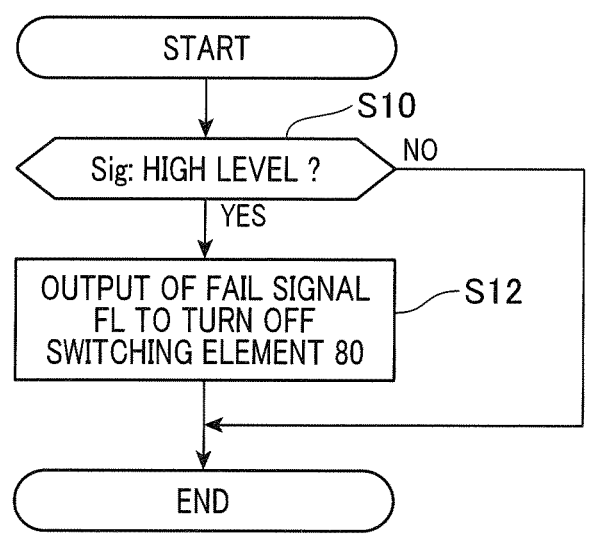
FIG. 6 is a flowchart showing steps of an overvoltage abnormality determination process performed by the IGBT drive circuit included in the insulated power supply apparatus according to the first embodiment of the invention.

FIG. 6 is a flowchart showing step of the overvoltage failure determination process. This process is performed at regular time intervals by the determination section 130. In this embodiment, the determination section 130 is constituted of hardware, and the process shown in FIG. 6 is executed by a logic circuit. The overvoltage failure determination process is explained below with reference to FIG. 6 for the drive circuits of the first power supply circuit mainly constituted of the first power supply IC 52.

This process begins in step S10 where it is determined whether or not the output signal Sig of the comparator 132 is at the H level (logic high level).

If the determination result in step S10 is affirmative, the process proceeds to step S12 assuming that the input voltage Vom is excessively high. In step S12, a fail signal FL is outputted to the first power supply IC 52. The fail signal FL contains a command to forcibly turn off the first voltage adjustment switching element 80. Accordingly, the first power supply IC 52 turns off the first voltage adjustment switching element 80 upon receiving the fail signal FL through the interface 44. As a result, supply of the driving voltage to the drive circuits Drc# and Dr1$# is forcibly stopped to protect these drive circuits from overvoltage.

If the determination result in step S10 is negative, or when step S12 is completed, this process is terminated.

The first embodiment described above provides the following advantages.

(1) In the first power supply circuit constituted mainly of the first power supply IC 52, the divided output voltage of the fifth secondary coil 68b, the output current of which is the largest of the first to fifth secondary coils 60b, 62b, 64b, 66b and 68b, is detected as the first feedback voltage Vfb1. The first power supply IC 52 on/off-controls the first voltage adjustment switching element 80 to feedback-controls the detected first feedback voltage Vfb1 to the target voltage Vtgt.

In this configuration, the output voltages of the first to fourth secondary coils 60b, 62b, 64b and 66b become higher than the output voltage of the fifth secondary coil 68b. This makes it possible to prevent the driving voltage supplied from the first to fourth secondary coils 60b, 62b, 64b and 66b to the drive circuit Drcp, Dr1Up, Dr1Vp and Dr1Wp, respectively, from dropping excessively. Accordingly, the conduction losses of the switching elements Scp, S1Up, S1Vp and S1Wp can be reduced.

In the second power supply circuit constituted mainly of the second power supply IC 54, the divided output voltage of the ninth secondary coil 96b, the output current of which is the largest of the sixth to ninth secondary coils 90b, 92b, 94b and 96b, is detected as the second feedback voltage Vfb2. The second power supply IC 54 on/off-controls the second voltage adjustment switching element 110 to feedback-controls the detected second feedback voltage Vfb2 to the target voltage Vtgt.

According to this configuration, the conduction losses of the switching elements S2Up, S2Vp and S2Wp can be reduced.

(2) The target voltage Vtgt is set such that the input voltages of the drive circuits Drc#, Dr1$# and Dr2$# ($=U, V, W: #=p, n) become higher than the lower limit Vα of the operation guarantee voltage range of the drive circuits Drc#, Dr1$# and Dr2$#. According to this setting, the drive circuits Drc#, Dr1$# and Dr2$# can be guaranteed to operate normally.

(3) The determination section 130 provided in each of the drive circuits Drc#, Dr1$# and Dr2$# outputs the command to forcibly turn off the first voltage adjustment switching element 80 (second voltage adjustment switching element 110) to the first power supply IC52 (second power supply IC54) upon determining that the output signal Sig of the comparator 132 is at the H level. This makes it possible to forcibly stop supply of the driving voltage to the drive circuits, to prevent the drive circuits from being applied with an overvoltage.

(4) The drive circuits Drc#, Dr1$# and Dr2$# have the same structure. Accordingly, the circuit design and the arm work design can be commonalized across the drive circuit Drc#, Dr1$# and Dr2$#, to shorten the development period of the insulated power supply apparatus and reduce the manufacturing cost.

(5) In the first power supply circuit mainly constituted of the first power supply IC 52, the first to fifth primary coils 60a, 62a, 64a, 66a and 68a are connected in parallel with one another. According to this configuration, the voltages across these respective coils can be made substantially the same irrespective of individual difference in their inductances, so that the output voltages of the secondary coils 60b, 62b, 64b, 66b and 68b can be made stable. This applies to the second power supply circuit mainly constituted of the second power supply IC 54.

Second Embodiment

Next, a second embodiment of the invention is described with a focus on differences with the first embodiment.

An insulated power supply apparatus according to the second embodiment does not include the stepup converter 30 unlike the first embodiment. In the second embodiment, a single power supply circuit mainly constituted of a third power supply IC 56 supplies the driving voltage to all the switching elements S1$# and S2$# constituting the first and second inverters 12 and 22.

Figure 7:
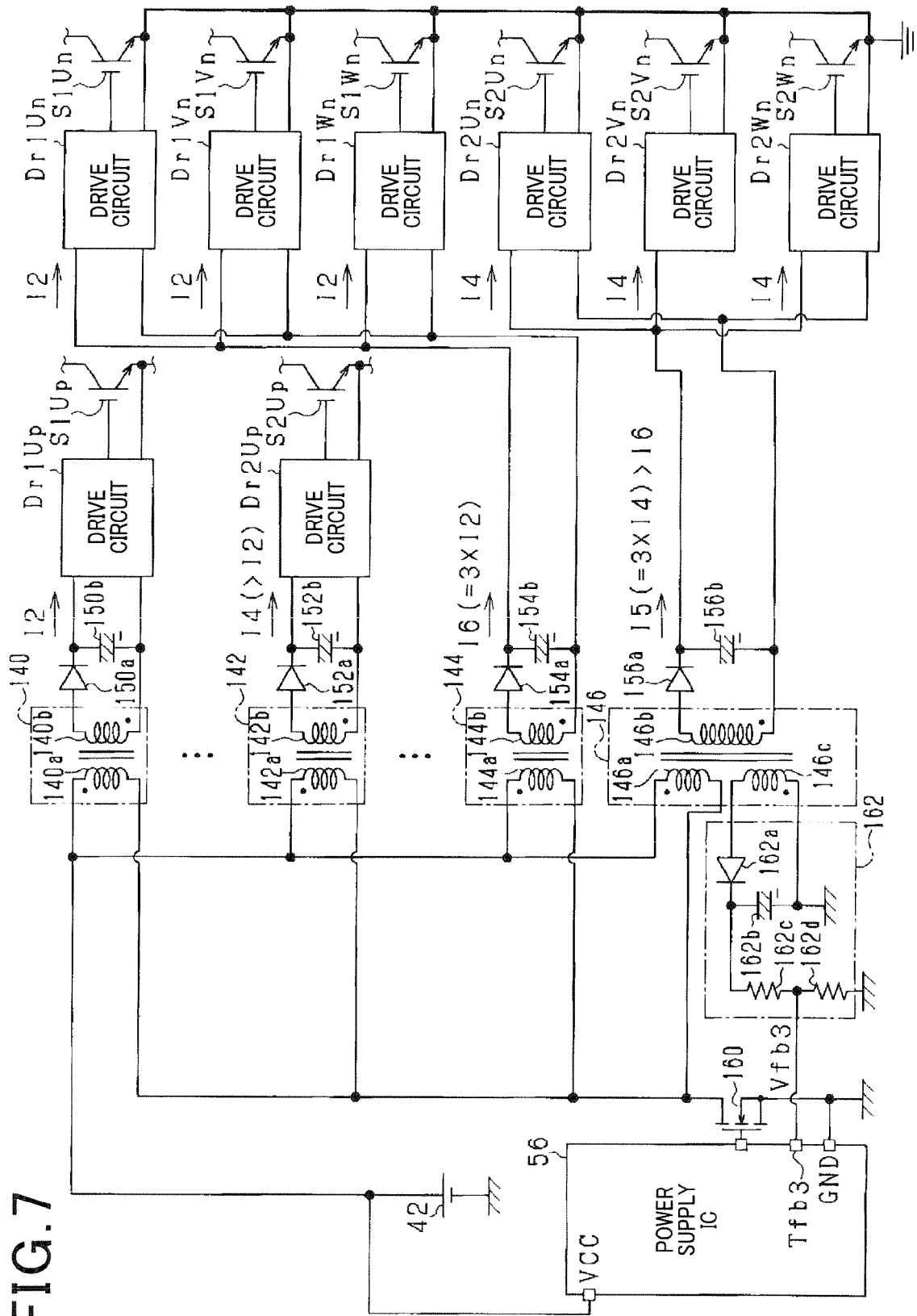
FIG. 7 is a diagram showing a structure of a single power supply circuit of an insulated power supply apparatus according to a second embodiment of the invention.

FIG. 7 is a diagram showing the structure of the power supply circuit of the insulated power supply apparatus according to the second embodiment of the invention.

In this embodiment, the driving voltage to be supplied to the drive circuits Dr1$# and Dr2$# is controlled by the third power supply IC 56.

The upper arm transformer is provided for each of the upper arm switching element S1Up, S1Vp, S1Wp, S2Up, S2Vp and S2Wp. In FIG. 7, the tenth transformer 140 for supplying the driving voltage to the first U-phase upper arm drive circuit Dr1Up is shown as a representative example for the first inverter 12, and the eleventh transformer 142 for supplying the driving voltage to the second U-phase upper arm drive circuit Dr2Up is shown as a representative example for the second inverter 22.

On the other hand, the lower arm transformer is common for the lower arm switching elements for each of the first and second inverters 12 and 22. More specifically, the twelfth transformer 144 supplies the driving voltage to the first U-, V- and W-phase lower arm drive circuits Dr1Un, Dr1Vn and Dr1Wn, and the thirteenth transformer 146 supplies the driving voltage to the second U-, V- and W-phase lower arm drive circuits Dr2Un, Dr2Vn and Dr2Wn.

The positive and negative electrode terminals of the low-voltage battery 42 are connected to each other through a parallel connection of the primary coils of the transformers corresponding to the first $-phase upper arm switching elements S1$p, the transformers corresponding to the second $-phase upper arm switching elements S2$p and the twelfth and thirteenth transformers 144 and 146, and through the third voltage adjustment switching element 160.

The tenth secondary coil 140b of the tenth transformer 140 is connected to the first U-phase upper arm drive circuit Dr1Up through the tenth diode 150a and the tenth capacitor 150b. The eleventh secondary coil 142b of the eleventh transformer 142 is connected to the second U-phase upper arm drive circuit Dr2Up through the eleventh diode 152a and the eleventh capacitor 152b.

The twelfth secondary coil 144b of the twelfth transformer 144 is connected to the first U-, V- and W-phase lower arm drive circuits Dr1Un, Dr1Vn and Dr1Wn through the twelfth diode 154a and the twelfth capacitor 154b. The thirteenth secondary coil 146b of the thirteenth transformer 146 is connected to the second U-, V- and W-phase lower arm drive circuits Dr2Un, Dr2Vn and Dr2Wn through the thirteenth diode 156a and the thirteenth capacitor 156b.

The thirteenth transformer 146 includes a third feedback coil 146c as a voltage detecting coil. The number of turns of the tenth to thirteenth secondary coils 140b, 142b, 144b and 146b is equal to the number of turns of the third feedback coil 146c.

The output voltage of the third feedback coil 146c is supplied to the third power supply IC 56 through the third feedback circuit 162. The third feedback circuit 162 includes a third detection diode 162a, a third detection capacitor 162b, a fifth resistor 162c and a sixth resistor 162d. The output voltage of the third feedback coil 146c is divided by the fifth resistor 162c and the sixth resistor 162d after passing the third detection diode 162a. The output voltage of the third feedback coil 146c divided by the fifth resistor 162c and the sixth resistor 162d is inputted to the third power supply IC 56 as a third feedback voltage Vfb3 through a third detection terminal Tfb3 of the third power supply IC 56. The thirteenth secondary coil 146b serves as an object coil, and the third feedback coil 146c and the third feedback circuit 162 serve as a voltage detecting section. The third power supply IC 56, which serves as a manipulation section, on/off-controls the third voltage adjustment switching element 160 to feedback-control the third feedback voltage Vfb3 to the target voltage Vtgt.

In this embodiment, the output voltage of the thirteenth secondary coil 146b is used as the controlled variable in the feedback control. This is because, of all the currents supplied respectively from the tenth to thirteenth secondary coils, the current I5 supplied from the thirteenth secondary coil 146b is the largest.

As described above, in the second embodiment, the output voltage of the thirteenth secondary coil 146b of the thirteenth transformer 146 for the second inverter 22 is used as the controlled variable in the feedback control. According to the second embodiment, the advantages similar to those provided by the first embodiment can be provided.

Third Embodiment

Figure 8:
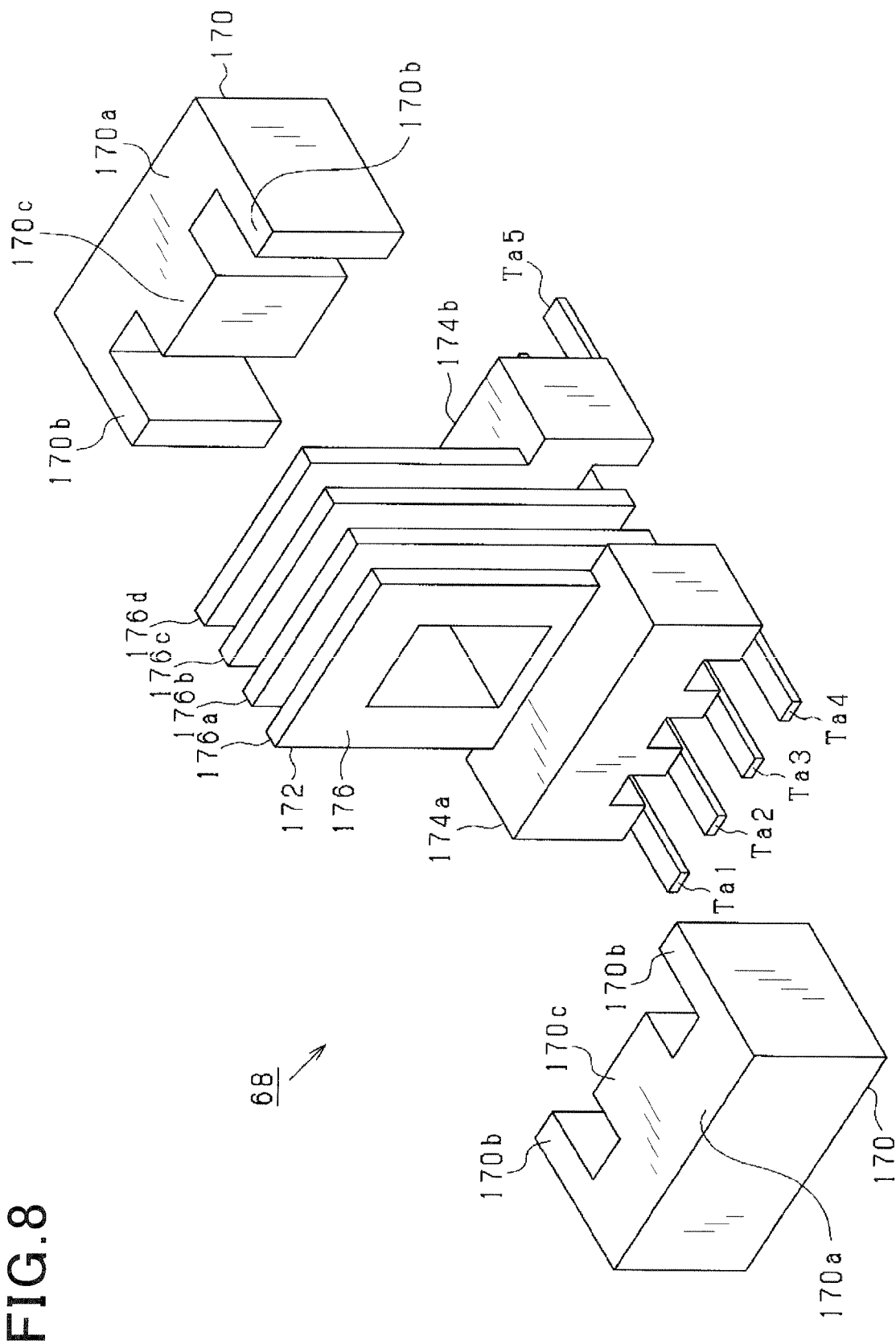
FIG. 8 is a perspective view of a transformer of an insulated power supply apparatus according to a third embodiment of the invention.
Figure 9:
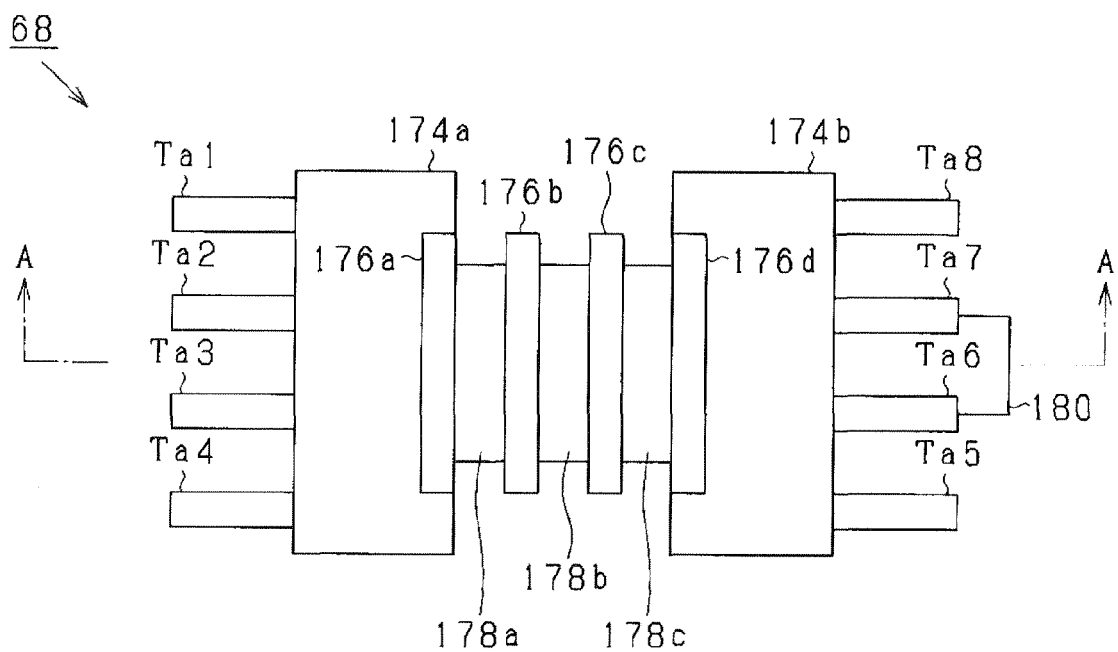
FIG. 9 is a plan view of the transformer of the insulated power supply apparatus according to the third embodiment of the invention.
Figure 10:
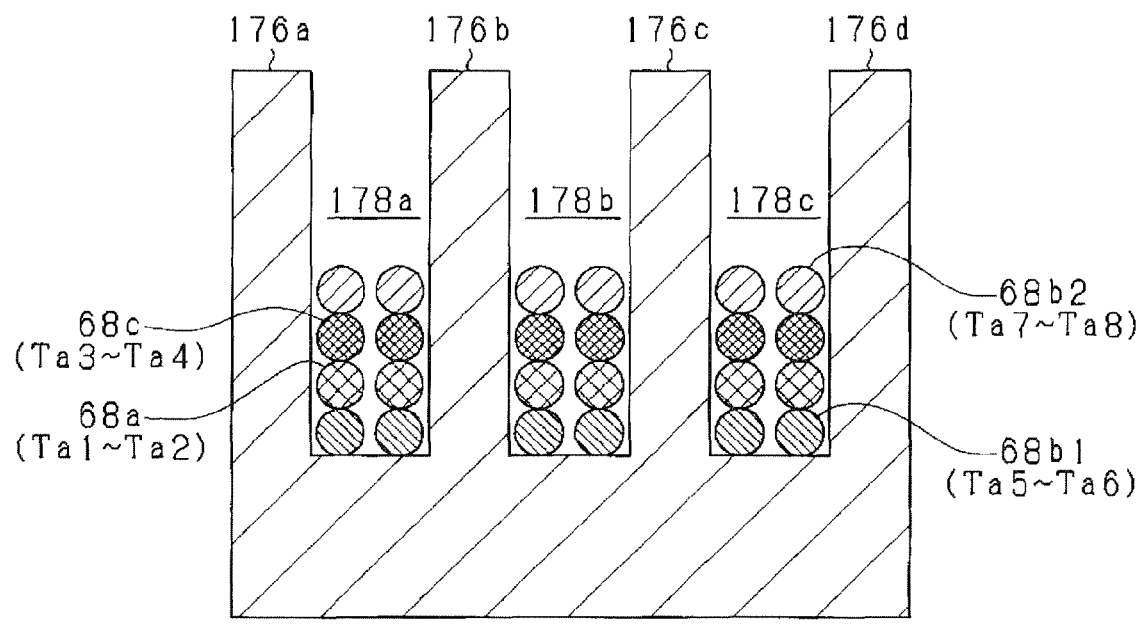
FIG. 10 is a cross-sectional view of FIG. 9 taken along line A-A.

Next, a third embodiment of the invention is described with a focus on differences with the first embodiment. In the third embodiment, the transformers 60, 62, 64, 66, 68, 90, 92, 94 and 96 have the structure as shown in FIGS. 8 to 10. Here, the structure of the fifth transformer 68 is explained as a representative example. FIG. 8 is a perspective view of the fifth transformer 68. FIG. 9 is a plan view of the fifth transformer 68. FIG. 10 is a cross-sectional view of FIG. 9 taken along line A-A. In FIGS. 8 and 9, the primary and secondary coils 68a and 68b of the fifth transformer 5 are omitted from illustration.

As shown in these figures, the fifth transformer 58 includes a pair of cores 170, and a bobbin 172. The core 170 includes a bottom wall portion 170a having an elongated shape, a pair of side wall portions 170b and a center wall portion 170c. The side wall portions 170b extending from both longitudinal ends of the bottom wall portion 170a, and the center wall portion 170c extends from the longitudinal center of the bottom wall portion 170a, such that the core 170 has an E-shape.

The end surface of the side wall portion 170b of one of the cores 170 abuts on the end surface of the side wall portion 170b of the other core 170. The end surface of the center wall portion 170c of one of the cores 170 abuts on the end surface of the center wall portion 170c of the other core 170.

The bobbin 172 is made of insulating resin, and includes a first terminal block 174a, a second terminal block 174b and an annular portion 176. The cross section of the annular portion 176 in the axial direction (the direction of insertion of the center wall portion 170c) has an annular shape. The center wall portions 170c are inserted into the space formed by the inner periphery of the annular portion 176.

The annular portion 176 includes first to fourth parting plates 176a to 176d at its periphery. The first to fourth parting plates 176a to 176d are formed so as to project outward along the entire of the periphery of the annular portion 176.

The periphery is divided into three sections by the first to fourth parting plates 176a to 176d. Here, these three sections are referred to as a first section 178a, a second section 178n and a third section 178c in the direction from left to right in FIG. 9.

The annular portion 176 is provided with the first terminal block 174a at one of axial ends thereof, and provided with the second terminal block 174b at the other axial end thereof. The first and second terminal blocks 174a and 174b are formed integrally with the annular portion 176, and accordingly made of the same insulating resin as the annular portion 176.

The first terminal block 174a includes first to fourth transformer terminals Ta1 to Ta4. These transformer terminals Ta1 to Ta4 are arranged at regular intervals in the longitudinal direction of the first terminal block 174a. The second terminal block 174b includes fifth to eighth transformer terminals Ta5 to Ta8. These transformer terminals Ta5 to Ta8 are arranged at regular intervals in the longitudinal direction of the second terminal block 174b.

Each of the fifth primary coil 68a, the fifth secondary coil 68b and the first feedback coil 68c is made of an insulated copper wire. The fifth secondary coil 68b is constituted of a first winding part 68b1 and a second winding part 68b2. As shown in FIG. 10, the fifth primary coil 68a, the first winding part 68b1, the second winding part 68b2 and the first feedback coil 68c are wound on the outer periphery of the annular portion 176 such that they are stacked on one another in each of the first, second and third sections 178a, 178b and 178c.

Next, wiring and connection of the primary coils etc. to the first to eighth transformer terminals Ta1 to Ta8 are explained.

One end of the first winding part 68b1, that is, one end of the fifth secondary coil 68b is connected to the eighth transformer terminal Ta8. The eighth transformer terminal Ta8 is connected to the anode of the fifth diode 78a. The other end of the first winding part 68b1 is connected to the seventh transformer terminal Ta7. The seventh transformer terminal Ta7 is connected to the sixth transformer terminal Ta6 through an electric path 180 such as a wiring pattern. The sixth transformer terminal Ta6 is connected to one end of the second winding part 68b2. The other end of the second winding part 68b2, that is, the other end of the fifth secondary coil 68b is connected to the fifth transformer terminal Ta5. The fifth transformer terminal Ta5 is connected to the negative electrode terminal of the fifth capacitor 78b.

One end of the first feedback coil 68c is connected to the third transformer terminal Ta3. The other end of the first feedback coil 68c is connected to the fourth transformer terminal Ta4. The third transformer terminal Ta3 is connected to the anode of the first detection diode 82a. The fourth transformer terminal Ta4 is grounded.

As explained in the foregoing, each of the first to fourth transformers 60, 62, 64 and 66, and sixth to eighth transformers 90, 92 and 94 does not include a feedback coil. Accordingly, the structure of these transformers 60, 62, 64, 66, 90, 92 and 94 is the same as the structure of the fifth transformer 68 shown in FIGS. 8 and 9 exclusive of the third and fourth transformer terminal Ta3 and Ta4 and the first feedback coil 68c shown in FIG. 10.

Next, the reason why the transformers having the structures described above are used is explained for the first power supply circuit mainly constituted of the first power supply IC 52 as a representative example.

As explained in the foregoing, the output voltage of each secondary coil decreases with the increase of the charging current supplied to the gate of the IGBT. Accordingly, the output voltage of each of the first to fourth secondary coils 60*b*, 62*b*, 64*b* and 66*b* of the first to fourth transformers 60, 62, 64 and 66 which are not detection objects varies depending on the charging current.

Further, the degree of drop of the first feedback voltage Vfb1 to the actual voltage of the fifth secondary coil 68*b* increases with the decrease of the coupling factor among the fifth primary coil 68*a*, the fifth secondary coil 68*b* and the first feedback coil 68*c*. Therefore, in this case, the variation in deviation from the target voltage Vtgt among the first to fourth secondary coils 60*b*, 62*b*, 64*b* and 66*b* become large in conjunction with the variation of the output voltage due to the charging current.

According to the configuration of the third embodiment described above, the coupling factor among the fifth primary coil 68*a*, the fifth secondary coil 68*b* and the first feedback coil 68*c* can be made large. This makes it possible to reduce the variation in deviation from the target voltage Vtgt among the first to fourth secondary coils 60*b*, 62*b*, 64*b* and 66*b*.

Other Embodiments

Figure 11:
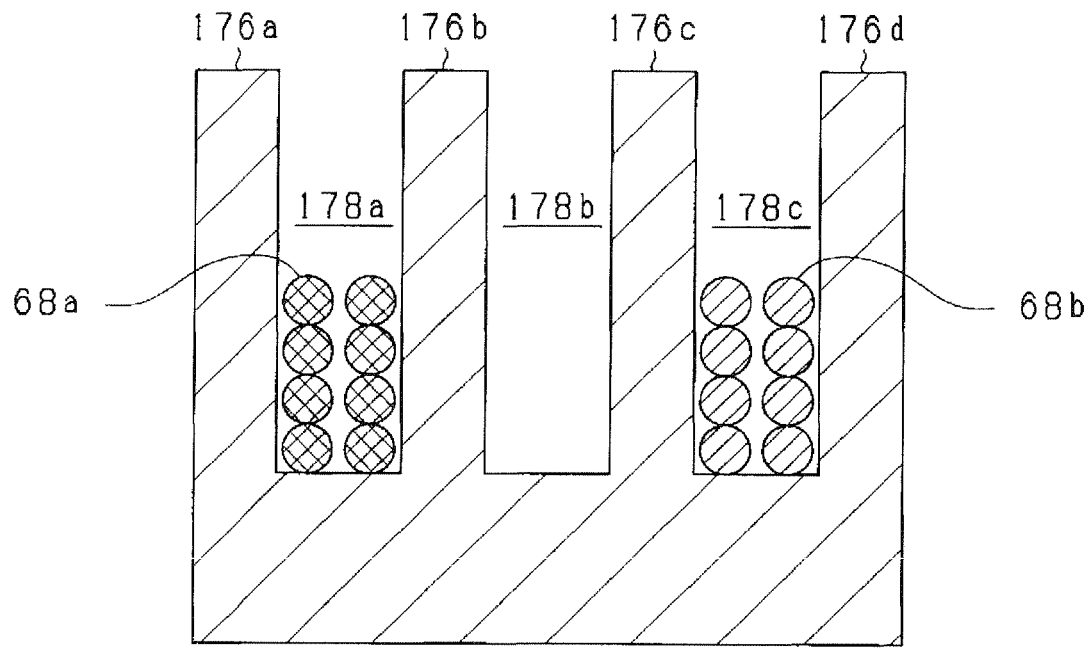
FIG. 11 is a cross-sectional view of a modification of the transformer of the insulated power supply apparatus according to the third embodiment of the invention.

The method of winding to the bobbin 172 is not limited to the one shown in FIG. 10. For example, as shown in FIG. 11, it is possible to use a sectional winding method where the fifth primary coil 68*a* is wound in the first section 178*a*, and the fifth secondary coil 68*b* is wound in the third section 178*c*, no coil being wound in the second section 178*b* to use the second section 178*b* as an insulating space. In this example, it is not imperative that the respective coils are insulation-coated.

In the above embodiments, the lower arm transformer is provided common to the lower arm switching elements of the power conversion circuit. However, the lower arm transformer may be provided for each of the lower arm switching elements like the upper arm transformers. In this case, in the first embodiment, the secondary coil of the transformer for supplying the driving voltage to the lower arm stepup switching element Scn is used as the object coil in the first power supply circuit mainly constituted of the first power supply IC 52. On the other hand, in the second embodiment, the object coil is set to one of the second U-, V- and W-phase upper arm switching elements S2Up, S2Vp and S2Wp and the second U-, V- and W-phase lower-arm switching elements S2Un, S2Vn and S2Wn.

In the first embodiment, the determination section 130 may be configured to output the fail signal to the control device at the higher level during the overvoltage failure determination process. In this case, the control device at the higher level may be configured to command the first power supply IC 52 to turn off the first voltage adjustment switching element 80.

The above embodiments may be modified such that the primary coils of the upper arm and lower arm transformers are connected in series.

In the first embodiment, the number of turns of the fifth secondary coil 68*b* and the number of turns of the first feedback coil 68*c* are the same as each other. However, they may be different from each other. In this case, the first feedback coil 68*c* constituting the voltage detecting section outputs a voltage depending on the output voltage of the fifth secondary coil 68*b*.

The first embodiment may be such that it does not include the stepup converter 30.

The motor control systems described above are two-motor control systems. However, the insulated power supply apparatus of the invention can be used also for a one-motor control system. For example, the one-motor system is the motor control system shown in FIG. 1 exclusive of one of the combination of the first motor-generator 10 and the first inverter 12 and the combination of the second motor-generator 20 and the second inverter 22, and the stepup converter 30.

The insulated power supply apparatuses described above are flyback converters. However, the insulated power supply apparatus of the invention can be used for a forward converter. Each of the above insulated power supply apparatuses described above includes one voltage adjustment element. However, the insulated power supply apparatus of the invention can be used for a full-bridge converter including four voltage adjustment switching elements or a push-pull converter including two voltage adjustment switching elements, which are described, for example, in "Keys to success in designing a power supply circuit" by Baba, Fourth edition, CQ publishing company, Japan, Feb. 1, 2012.

In the above embodiments, the voltage detection coil is used to detect the output voltage of the secondary coil. However, the output voltage of the secondary coil can be detected in various ways. For example, the inter-terminal voltage across the terminals of the fifth capacitor 78*b* or a voltage depending on this inter-terminal voltage may be detected using a device capable of transmitting a signal indicating a detected value to the first power supply IC 52. Such a device may be a photocoupler capable of transmitting a PWM signal to the first power supply IC 52.

In the above embodiments, the power conversion circuit is a stepup converter or a three-phase inverter. However, the power conversion circuit may be a half-bridge circuit or a full-bridge circuit. The upper arm and lower arm switching elements does not necessary have to be IGBTs. They may be MOSFETs.

The above explained preferred embodiments are exemplary of the invention of the present application which is described solely by the claims appended below. It should be understood that modifications of the preferred embodiments may be made as would occur to one of skill in the art.

What is claimed is:
1. An insulated power supply apparatus for at least one power conversion circuit that includes at least one series connection of an upper arm switching element and a lower arm switching element connected in series to each other, comprising:
    upper arm transformers each including an upper arm primary coil to be applied with a DC voltage from a DC power source and an upper arm secondary coil for supplying a first driving voltage to the upper arm switching element;
    a lower arm transformer including a lower arm primary coil to be applied with the DC voltage from the DC power source and a lower arm secondary coil for applying a second driving voltage to the lower arm switching element;
    a voltage detecting section for detecting an output voltage of an object coil which is the lower arm secondary coil, an output current of the lower arm secondary coil being larger than the upper arm secondary coil;
    a voltage adjustment switching element that applies the DC voltage of the DC power source to the upper arm and lower arm primary coils while being turned on; and
    a manipulation section that on/off controls the voltage adjustment switching element in order that the output voltage detected by the voltage detecting section is feedback-controlled to a target voltage;

wherein the power conversion circuit includes a plurality of the series connections which are parallel-connected, the upper arm transformers are respectively provided for a plurality of the upper arm switching elements, the lower arm transformer is provided common to a plurality of the lower arm switching elements, the lower arm secondary coil is capable of outputting the second driving voltage to the plurality of the lower arm switching elements.

2. The insulated power supply apparatus according to claim 1, wherein the insulated power supply apparatus is for a plurality of the power conversion circuits each including a plurality of the series connections, one of the power conversion circuits is a driving power conversion circuit for driving an electric rotating machine as a vehicle driving engine, the upper arm transformers are respectively provided the plurality of the upper arm switching elements for each of the plurality of the power conversion circuits, the lower arm transformer is provided common to the plurality of the lower arm switching elements for each of the plurality of the power conversion circuits, a charging current necessary to turn on each of the upper arm and lower arm switching elements of the driving power conversion circuit is larger than a charging current necessary to turn on each of the upper arm and lower arm switching elements of any power conversion circuit other than the driving power conversion circuit.

3. The insulated power supply apparatus according to claim 1, further comprising an upper arm drive circuit for driving the upper arm switching element using the first driving voltage supplied from the upper arm secondary coil and a lower arm drive circuit for driving the lower arm switching element using the second driving voltage supplied from the lower arm secondary coil, the upper arm drive circuit and the lower arm drive circuit being the same in structure.

4. The insulated power supply apparatus according to claim 3, wherein the target voltage is set above a lower limit of an operation guarantee voltage range of the upper arm and lower arm drive circuits.

5. The insulated power supply apparatus according to claim 1, further comprising an upper arm drive circuit for driving the upper arm switching element using the first driving voltage supplied from the upper arm secondary coil, and a lower arm drive circuit for driving the lower arm switching element using the second driving voltage supplied from the lower arm secondary coil, the upper arm drive circuit connected to the upper arm secondary coil of the upper arm transformer including an overvoltage protection function that forcibly stops supply of the first and second driving voltages to the upper arm and lower arm switching elements by the manipulation section if the first or second driving voltage inputted thereto exceeds a predetermined voltage.

6. The insulated power supply apparatus according to claim 1, wherein the first and second primary coils of the upper arm and lower arm transformers are connected in parallel to each other as a parallel connection, and the voltage adjustment switching element forms a closed circuit including the DC power source, the parallel connection and the voltage adjustment switching element.

7. The insulated power supply apparatus according to claim 1, wherein the lower arm transformer including the object coil includes a voltage detecting coil, and the voltage detecting section detects an output voltage of the voltage detecting coil as the output of the object coil.

8. The insulated power supply apparatus according to claim 1, wherein each of the first and second primary coils and the first and second secondary coils is insulation-coated, and is wound on a bobbin fitted to a core.

9. The insulated power supply apparatus according to claim 1, wherein the lower arm secondary coil is configured to output a current that is largest of all of the upper arm and lower arm secondary coils.

10. The insulated power supply apparatus according to claim 1, wherein the output current that is the largest of all of the upper arm and lower arm secondary coils is detected as the output voltage for feedback control to the target voltage.

* * * * *